(12) United States Patent
Shiota et al.

(10) Patent No.: US 10,591,330 B2
(45) Date of Patent: Mar. 17, 2020

(54) FLOW RATE MEASUREMENT DEVICE

(71) Applicant: Panasonic Intellectual Property Management Co., Ltd., Osaka (JP)

(72) Inventors: Kazuki Shiota, Kyoto (JP); Kenji Yasuda, Kyoto (JP); Ryuji Iwamoto, Nara (JP); Yuji Fujii, Nara (JP); Yasuo Koba, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/085,084

(22) PCT Filed: Dec. 15, 2016

(86) PCT No.: PCT/JP2016/005142
§ 371 (c)(1),
(2) Date: Sep. 14, 2018

(87) PCT Pub. No.: WO2017/168480
PCT Pub. Date: Oct. 5, 2017

(65) Prior Publication Data
US 2019/0078918 A1 Mar. 14, 2019

(30) Foreign Application Priority Data
Mar. 29, 2016 (JP) .................. 2016-065338

(51) Int. Cl.
*G01F 1/66* (2006.01)
*G05F 1/46* (2006.01)
(Continued)

(52) U.S. Cl.
CPC ............. *G01F 1/667* (2013.01); *G05F 1/46* (2013.01); *H03K 5/24* (2013.01); *G01R 19/175* (2013.01)

(58) Field of Classification Search
CPC .............. G01F 1/66; A61B 5/087; H03K 5/24
See application file for complete search history.

(56) References Cited

U.S. PATENT DOCUMENTS 7,044,000 B2 * 5/2006 Feller ...................... G01F 1/66
73/597
7,117,104 B2 * 10/2006 Urdaneta .................. G01F 1/66
702/48
(Continued)

FOREIGN PATENT DOCUMENTS

CN 102667418 9/2012
CN 104428638 3/2015
(Continued)

OTHER PUBLICATIONS

International Search Report of PCT application No. PCT/JP2016/005142 dated Feb. 28, 2017.
(Continued)

*Primary Examiner* — Jewel V Dowtin
(74) *Attorney, Agent, or Firm* — Wenderoth, Lind & Ponack, L.L.P.

(57) ABSTRACT

Flow rate measurement is performed with a propagation time by using a pair of ultrasonic wave oscillators which is provided in flow path through which a fluid to be measured flows, and is disposed so as to transmit and receive an ultrasonic wave signal by causing the ultrasonic wave signal to be reflected on an inner wall of flow path at least once. In addition, adjustment of an amplification rate is periodically performed by amplifier, which amplifies the ultrasonic wave signal received by each of the ultrasonic wave oscillators to a predetermined amplitude, and a difference between a previous amplification rate and a current amplification rate is a predetermined value or more, and the instantaneous flow rate calculated by flow rate calculation unit is a predetermined flow rate or less, the reference voltage is adjusted by
(Continued)

reference voltage setting unit. With the configuration, the propagation time can be stably measured and deterioration of the maximum amplitude is prevented.

1 Claim, 7 Drawing Sheets

(51) Int. Cl.
   *H03K 5/24* (2006.01)
   *G01R 19/175* (2006.01)

(56) References Cited

U.S. PATENT DOCUMENTS

| | | | | |
|---|---|---|---|---|
| 7,520,180 | B2* | 4/2009 | Deutscher | G01F 1/668 |
| | | | | 73/861.27 |
| 7,712,382 | B2* | 5/2010 | Takeda | G01F 1/663 |
| | | | | 73/861.18 |
| 9,638,557 | B2* | 5/2017 | Takemura | G01F 1/66 |
| 2004/0020307 | A1 | 2/2004 | Eguchi et al. | |
| 2008/0250870 | A1* | 10/2008 | Rhodes | G01F 1/66 |
| | | | | 73/861.27 |
| 2009/0276167 | A1* | 11/2009 | Glaser | A61B 5/087 |
| | | | | 702/48 |
| 2012/0255368 | A1 | 10/2012 | Gotou et al. | |
| 2014/0236533 | A1* | 8/2014 | Drachmann | G01F 1/667 |
| | | | | 702/176 |
| 2015/0135850 | A1 | 5/2015 | Gotou et al. | |

FOREIGN PATENT DOCUMENTS

| | | |
|---|---|---|
| JP | 2003-106882 | 4/2003 |
| JP | 2011-017543 | 1/2011 |
| JP | 2012-002708 | 1/2012 |
| JP | 2014-016192 | 1/2014 |

OTHER PUBLICATIONS

English Translation of Chinese Search Report dated Dec. 3, 2019 in Chinese Patent Application No. 201680084163.X.

* cited by examiner

Proir Art

FLOW RATE MEASUREMENT DEVICE

This application is a U.S. national stage application of the PCT International Application No. PCT/JP2016/005142 filed on Dec. 15, 2016, which claims the benefit of foreign priority of Japanese patent application No. 2016-065338 filed on Mar. 29, 2016, the contents all of which are incorporated herein by reference.

TECHNICAL FIELD

The present invention relates to a flow rate measurement device that measures a flow of a fluid such as a gas using ultrasonic waves.

BACKGROUND ART

This type of a flow rate measurement device of a fluid in the related art is generally configured as illustrated in a configuration diagram of FIG. 5 (for example, see PTL 1).

The flow rate measurement device includes first ultrasonic wave oscillator 122 and second ultrasonic wave oscillator 123 installed in flow path 121 through which a fluid flows, and switching unit 124 for switching transmission and reception of first ultrasonic wave oscillator 122 and second ultrasonic wave oscillator 123. In addition, the flow rate measurement device includes transmitting unit 125 for driving first ultrasonic wave oscillator 122 and second ultrasonic wave oscillator 123, amplifier 126 that amplifies a received signal which is received by an ultrasonic wave oscillator on a receiving side and passes through switching unit 124 to a predetermined amplitude, and reference comparator 127 for comparing a voltage of the received signal amplified by amplifier 126 with a reference voltage.

The flow rate measurement device includes determination unit 128 that detects zero-cross point a of the received signal after amplified received signal A is compared with reference voltage Vr by reference comparator 127 and the received signal becomes larger than reference voltage Vr as illustrated in an explanatory view of FIG. 6. Furthermore, the flow rate measurement device includes time measuring unit 129 that measures a propagation time of transmission and reception of the ultrasonic waves from timing detected by determination unit 128, and controller 130 that performs control of transmitting unit 125 and amplifier 126, and calculates a flow speed and/or a flow rate based on a time measured by time measuring unit 129.

Transmitting unit 125 is operated by controller 130 and an ultrasonic wave signal transmitted by first ultrasonic wave oscillator 122 propagates in the flow, is received by second ultrasonic wave oscillator 123, and is amplified by amplifier 126, and then is signal-processed by reference comparator 127 and determination unit 128, and is input into time measuring unit 129.

Next, first ultrasonic wave oscillator 122 and second ultrasonic wave oscillator 123 are switched by switching unit 124, and the same operation is performed, so that respective propagation times of a fluid to be measured from an upstream side to a downstream side (assuming the direction to be a forward flow) and from the downstream side to the upstream side (assuming the direction to be a reverse flow) are measured by time measuring unit 129.

Here, a flow rate Q can be obtained by the following equation in which an effective distance between the ultrasonic wave oscillators in a flowing direction is L, the propagation time from the upstream side to the downstream side is t1, the propagation time from the downstream side to the upstream side is t2, the flow speed of the fluid to be measured is v, a cross-sectional area of the flow path is S, and a sensor angle is φ.

$$Q = S \cdot v = S \cdot L/2 \cdot \cos \phi (n/t1 - n/t2) \quad \text{(Equation 1)}$$

Actually, a flow rate is calculated by further multiplying a coefficient corresponding to the flow rate to Equation 1.

In addition, an amplification rate of amplifier 126 is adjusted such that controller 130 adjusts an amplification degree to cause the signal received by the ultrasonic wave oscillator (first ultrasonic wave oscillator 122 or second ultrasonic wave oscillator 123) on the receiving side to have a constant amplitude, and a maximum voltage value of the received signal falls within a predetermined voltage range.

During the measurement, in a case where the maximum voltage value of the received signal falls below a lower limit (voltage range lower limit) of the predetermined voltage range as illustrated by received signal b in a broken line of an explanatory view of FIG. 7 or exceeds an upper limit (voltage range upper limit) of the predetermined voltage range as similarly illustrated by received signal c in a broken line of FIG. 7, the amplification rate at the next flow rate measurement is adjusted. For example, in a case where the maximum voltage value falls below the lower limit, the amplification degree is increased so that the maximum voltage value falls between the upper limit and the lower limit of the voltage range like received signal illustrated in a solid line of FIG. 7.

In addition, the reference voltage of reference comparator 127, which is compared with the received signal amplified by amplifier 126, determines the position of the zero-cross point detected by determination unit 128. Therefore, in FIG. 6, for example, the reference voltage is set to a voltage of a midpoint of peak voltages of a third wave and the fourth wave of the received signal when propagating in the air such that zero-cross point a of the fourth wave of the received signal is detected by determination unit 128.

By doing so, even if the peak voltage of the third wave increases or the peak voltage of the fourth wave decreases for some reason, a margin is obtained for both the peak voltage of the third wave and the peak voltage of the fourth wave and determination unit 128 can stably detect zero-cross point a of the fourth wave.

Moreover, in the configuration described in PTL 1, since the reference voltage is always a fixed value, for example, in order to stably detect zero-cross point a, as illustrated in FIG. 6, the reference voltage is set to the midpoint of the third wave peak and the fourth wave peak in which an interval of the peak voltages of the received wave is the widest when propagating in the air. However, in a case where a measurement object changes from the air to a gas other than the air, a received waveform may significantly change from the case of the air depending on the gas. As a result, there is a problem that in a case where the peak of the third wave of the received signal greatly increases, the zero-cross point of the third wave is erroneously detected, or in a case where the peak of the fourth wave of the received signal greatly decreases, a zero-cross point of a fifth wave is erroneously detected.

As a countermeasure against this, there is a method of changing the reference voltage according to the amplification degree in amplifier 126 so that the zero-cross point of the fourth wave can be stably measured with respect to various gases (for example, see PTL 2).

CITATION LIST

Patent Literature

PTL 1: Japanese Patent Unexamined Publication No. 2003-106882
PTL 2: Japanese Patent Unexamined Publication No. 2014-16192

SUMMARY OF THE INVENTION

As a method of measuring a flow rate using a propagation time of the ultrasonic wave as described above, there is a propagation method (referred to as a V path, a W path, or the like) of improving measurement accuracy by providing a pair of ultrasonic wave oscillators on a same surface of the flow path, reflecting an ultrasonic wave signal transmitted from one ultrasonic wave oscillator on an inner surface of the flow path, and receiving the ultrasonic wave signal by the other ultrasonic wave oscillator, thereby lengthening a propagation distance.

However, in a case where such a V path or W path method is used in the flow rate measurement device of the related art described above, it can be measured without problems in a case where a measurement object changes from the air to a gas other than the air, or the like, but in a case where dew condensation occurs in the flow path and the dew condensation adheres to a reflection surface of the ultrasonic wave, there is a problem that a waveform of the reflected wave greatly changes and a zero cross of the wave of a detection object (fourth wave in PTL 1 and PTL 2) cannot be detected.

The present invention provides a flow rate measurement device capable of stably measuring a zero-cross point of a wave of a detection object by performing adjustment of a reference voltage in a case where a phenomenon capable of estimating adhesion of water droplets on a reflection surface of ultrasonic waves occurs, so that degradation of measurement accuracy can be prevented.

The flow rate measurement device of the invention includes a pair of ultrasonic wave oscillators which is provided in a flow path through which a fluid to be measured flows, and is disposed so as to transmit and receive an ultrasonic wave signal by causing the ultrasonic wave signal to be reflected on an inner wall of the flow path at least once; a transmitting unit that drives the ultrasonic wave oscillators; and a switching unit that switches transmission and reception of the ultrasonic wave oscillators. In addition, the flow rate measurement device includes an amplifier that amplifies the ultrasonic wave signal received each of the ultrasonic wave oscillators to a predetermined amplitude; a reference comparator that compares an output of the amplifier with a reference voltage; a reference voltage setting unit that adjusts and sets the reference voltage; and a determination unit that determines an arrival time of the ultrasonic wave signal from outputs of the reference comparator and the amplifier. In addition, the flow rate measurement device includes a time measuring unit that measures a propagation time of transmission and reception of the ultrasonic wave signal from the arrival time of the ultrasonic wave signal determined by the determination unit; and a flow rate calculation unit that calculates an instantaneous flow rate of the fluid to be measured based on the propagation time measured by the time measuring unit. Furthermore, adjustment of an amplification rate is periodically performed by the amplifier and a difference between a previous amplification rate and a current amplification rate is a predetermined value or more, and the instantaneous flow rate calculated by the flow rate calculation unit is a predetermined flow rate or less, the reference voltage is adjusted by the reference voltage setting unit.

Therefore, the zero-cross point of the wave of the detection object can be stably measured by performing adjustment of the reference voltage in a case where a phenomenon capable of estimating adhesion of water droplets occurs, so that degradation of measurement accuracy can be prevented.

DESCRIPTION OF EMBODIMENT

Hereinafter, an embodiment of the invention will be described with reference to the drawings. Moreover, the present invention is not limited by the embodiment.
(Embodiment)

The embodiment of the invention will be described with reference to FIGS. 1 to 4.

Figure 1:
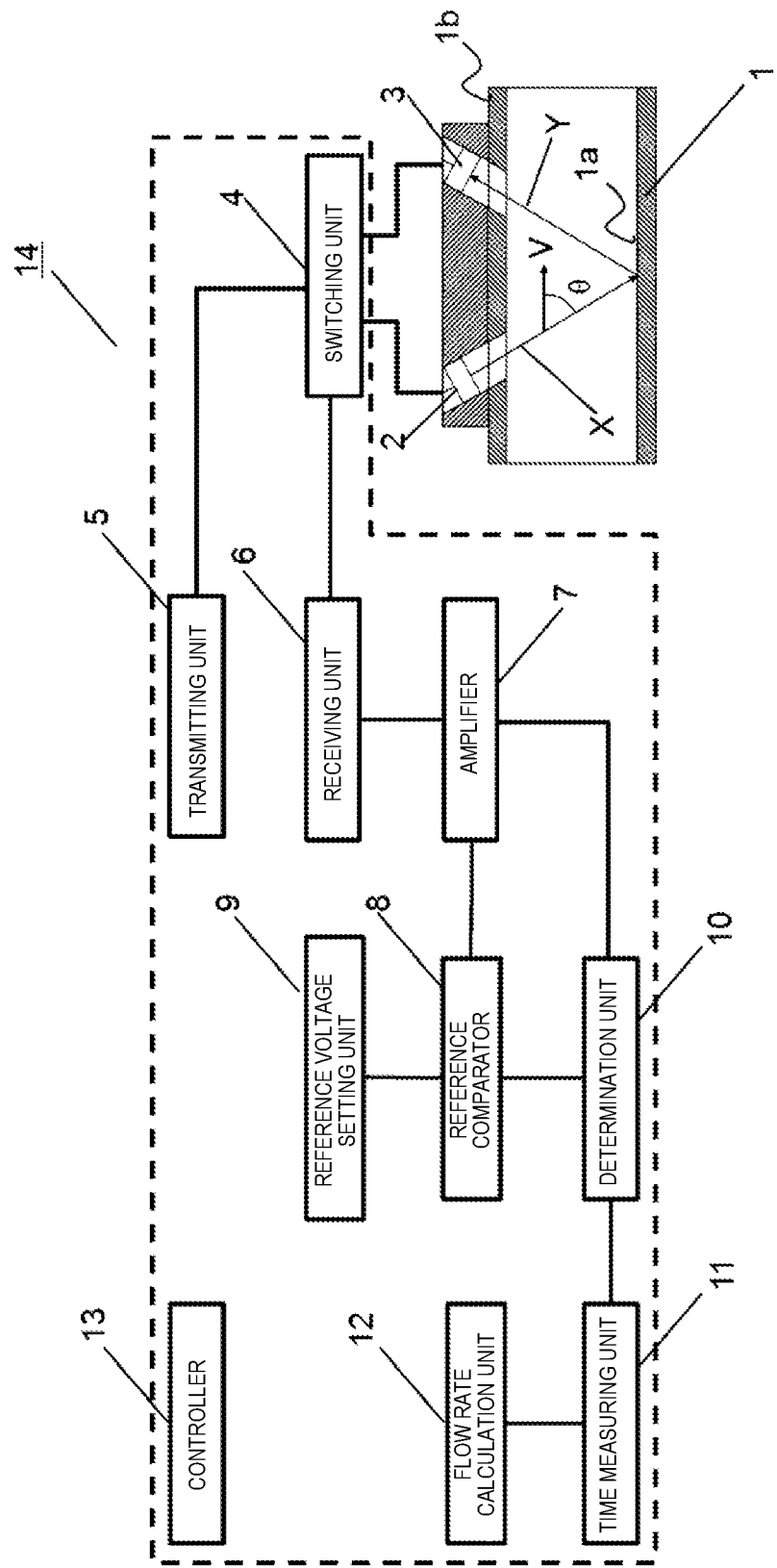
FIG. 1 is a configuration diagram of a flow rate measurement device in an embodiment of the invention.
Figure 2:
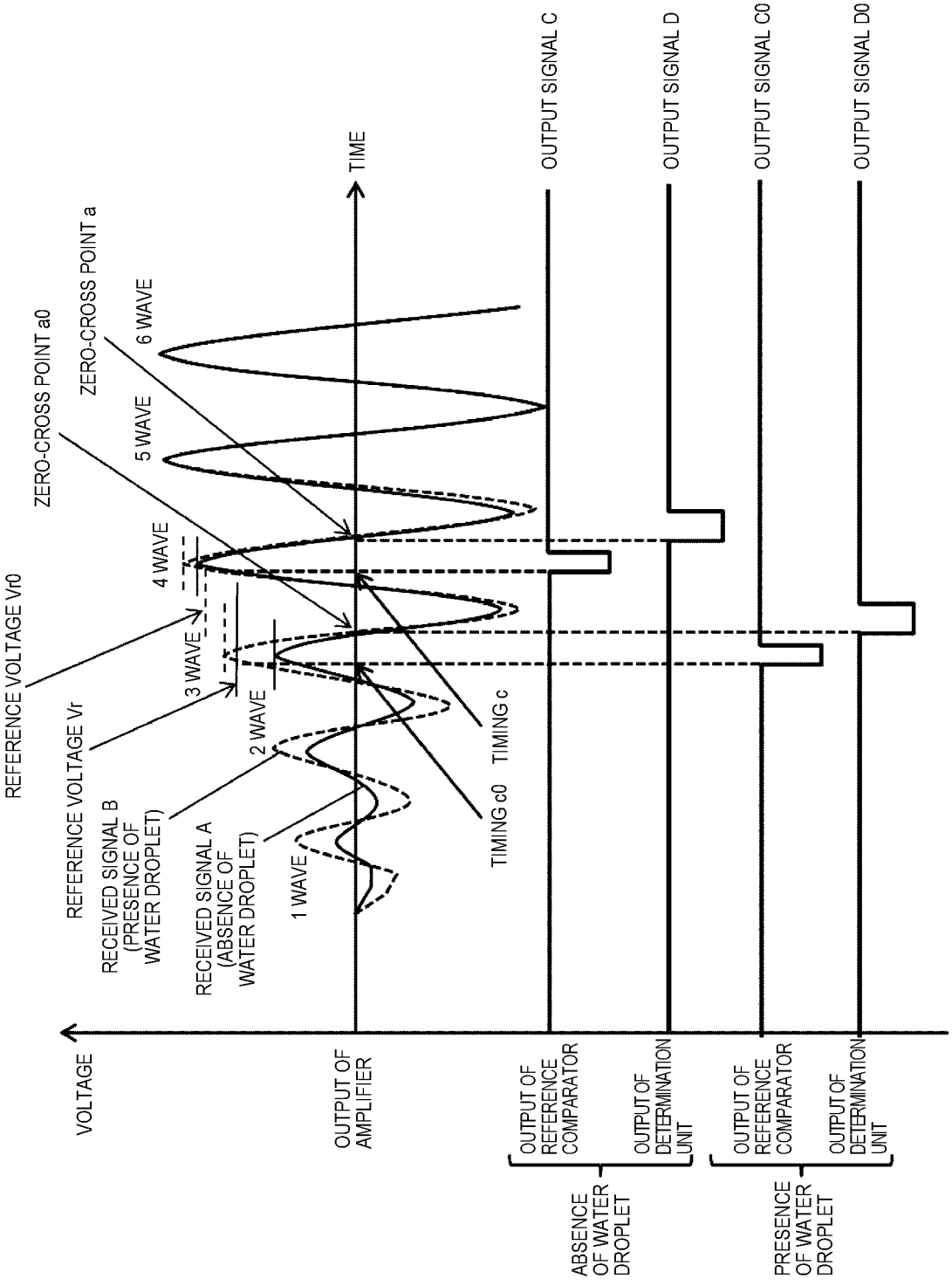
FIG. 2 is an explanatory view for explaining a setting method of a reference voltage in the flow rate measurement device in the embodiment of the invention.
Figure 3:
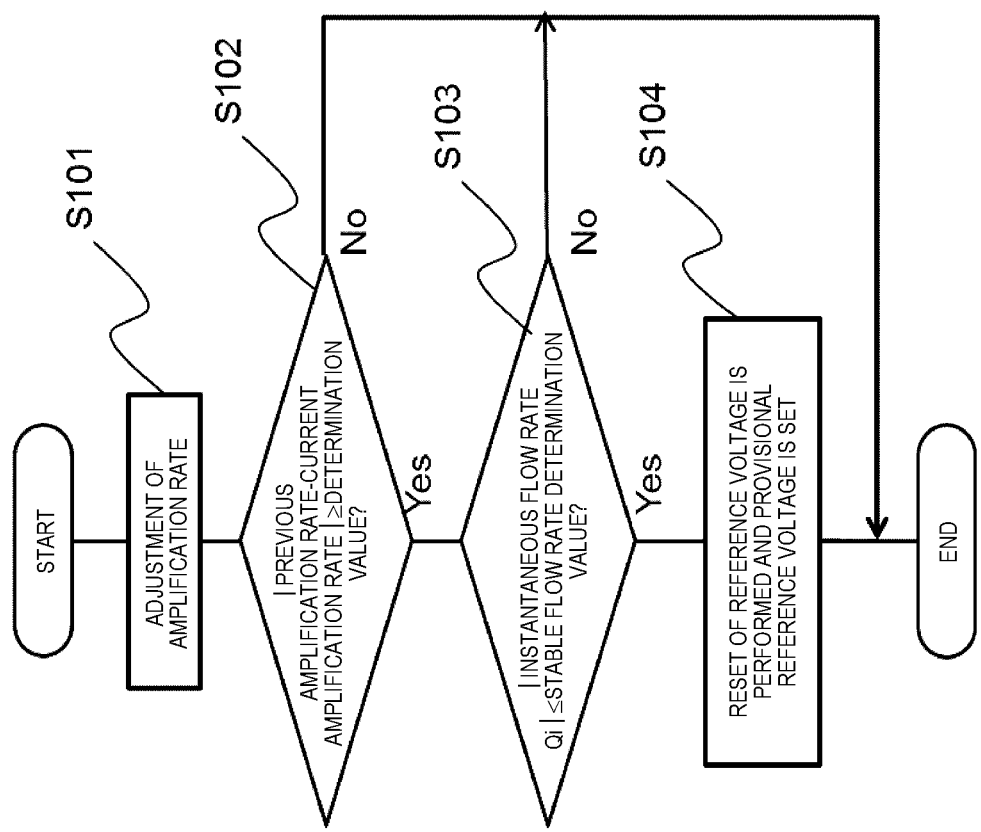
FIG. 3 is a flowchart for explaining a method of setting a provisional reference voltage in a reference voltage setting unit in the flow rate measurement device in the embodiment of the invention.
Figure 4:
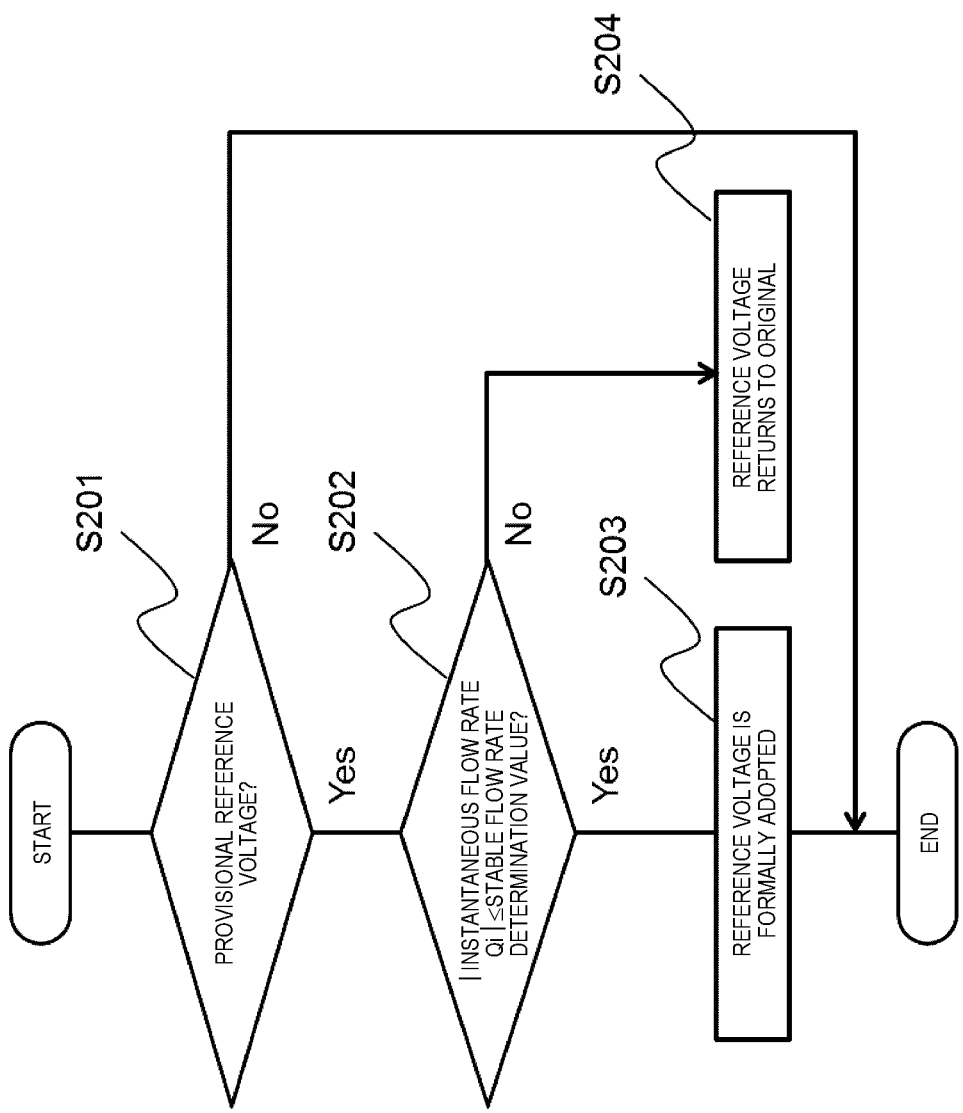
FIG. 4 is a flowchart for explaining a determination method using the provisional reference voltage as a formal reference voltage in the flow rate measurement device in the embodiment of the invention.
Figure 5:
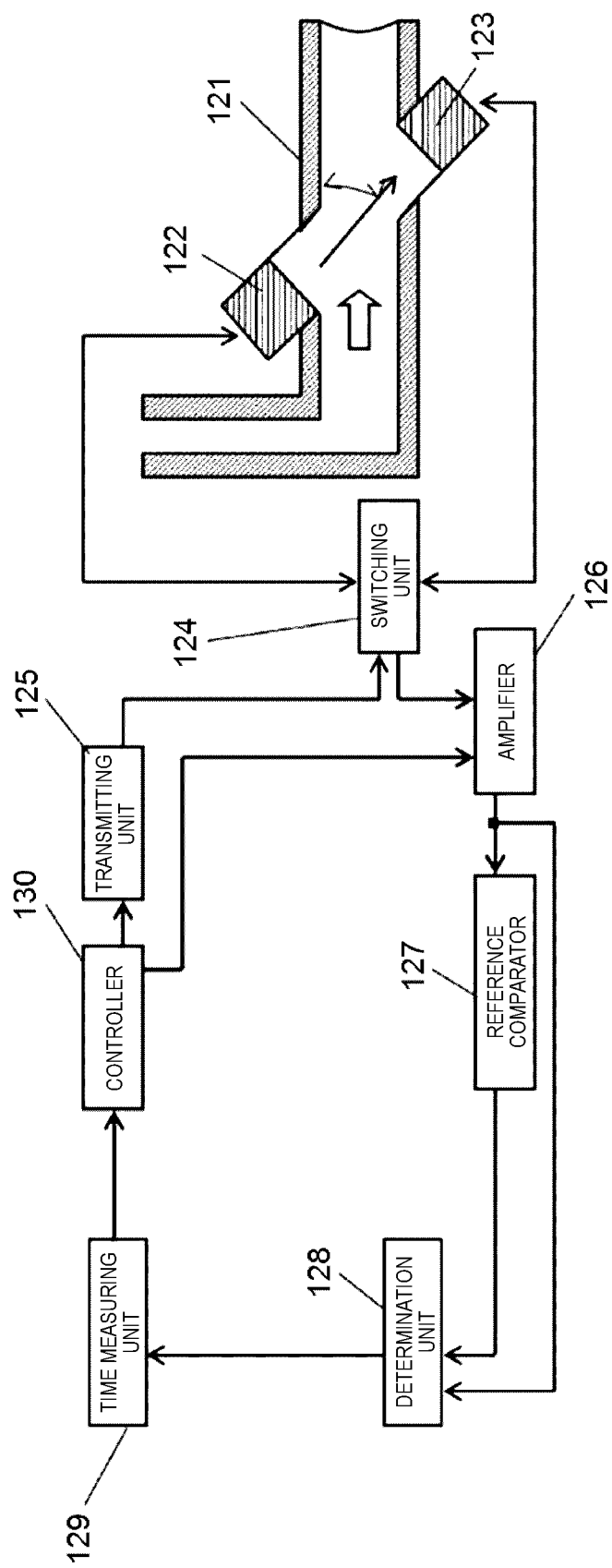
FIG. 5 is a configuration diagram of a flow rate measurement device of the related art.
Figure 6:
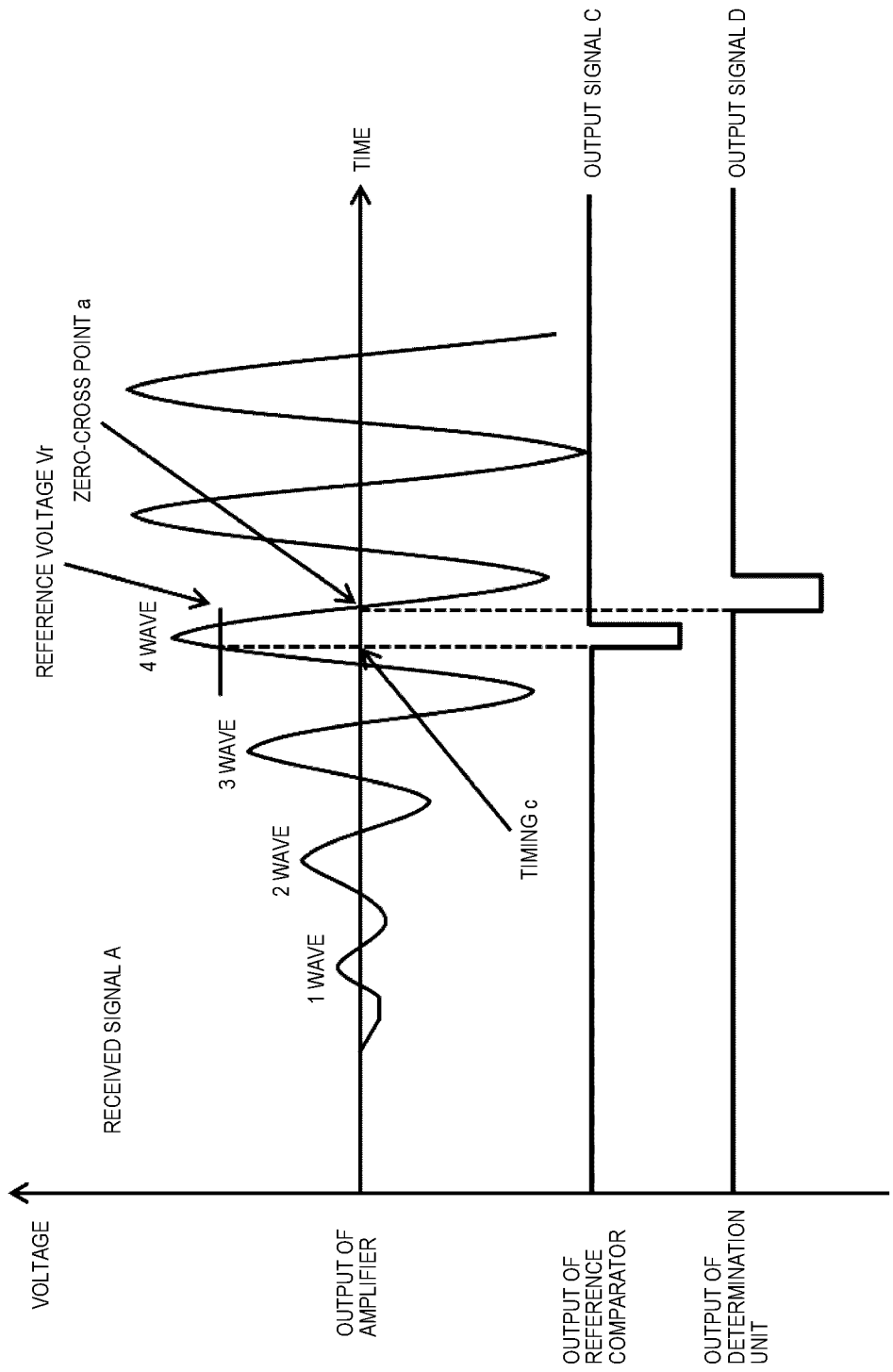
FIG. 6 is an explanatory view for explaining an operation of determining a zero-cross point from a received signal in the flow rate measurement device of the related art.
Figure 7:
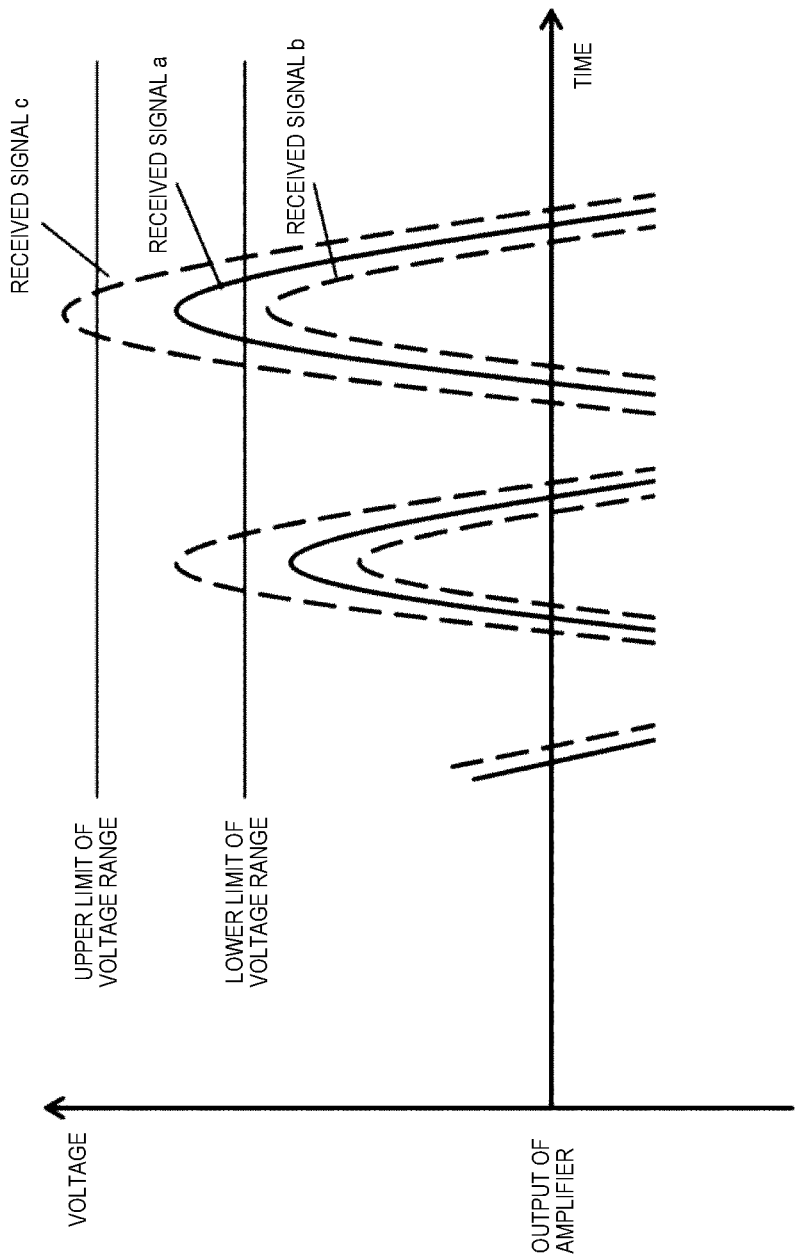
FIG. 7 is an explanatory view for explaining an operation of amplitude degree adjustment in the flow rate measurement device of the related art.

FIG. 1 is a configuration diagram of a flow rate measurement device in the embodiment of the invention. FIG. 2 is an explanatory view for explaining an operation of determining a zero cross from a waveform and a received signal after amplification of the received signal by presence or absence of water droplets in the flow rate measurement device in the embodiment. In the drawing, a solid line indicates a received waveform in a case of the absence of the water droplets and a broken line indicates a received waveform in a case of the presence of the water droplets. FIGS. 3 and 4 are flowcharts for explaining a method of setting a reference voltage in a reference voltage setting unit in the flow rate measurement device in the embodiment.

In FIG. 1, flow rate measurement device 14 of the invention is configured of a pair of ultrasonic wave oscillators in a middle of flow path 1 through which a fluid to be measured flows, and first ultrasonic wave oscillator 2 and second ultrasonic wave oscillator 3, which transmit and receive ultrasonic waves, are disposed on same surface 1*b* (upper surface in the drawing) of flow path 1 at a distance.

First ultrasonic wave oscillator 2 and second ultrasonic wave oscillator 3 configuring the pair of the ultrasonic wave oscillators have functions of transmitting and receiving the ultrasonic waves, and the functions are selected by switching unit 4. An output signal of transmitting unit 5 is supplied to the ultrasonic wave oscillator (first ultrasonic wave oscillator 2 or second ultrasonic wave oscillator 3) selected as the transmission side, and the ultrasonic wave received by the ultrasonic wave oscillator (first ultrasonic wave oscillator 2 or second ultrasonic wave oscillator 3) selected as the reception side is supplied to receiving unit 6 as an ultrasonic wave signal.

In a case where first ultrasonic wave oscillator 2 is set as the transmission side and second ultrasonic wave oscillator 3 is set as the reception side, as indicated by arrow X and arrow Y in the drawing, the ultrasonic wave is transmitted by first ultrasonic wave oscillator 2, is reflected on inner wall 1a of flow path 1, and follows a propagation path reaching second ultrasonic wave oscillator 3. In a case where first ultrasonic wave oscillator 2 is set as the reception side and second ultrasonic wave oscillator 3 is set as the transmission side, the ultrasonic wave follows a reverse propagation path.

The ultrasonic wave signal supplied to receiving unit 6 is sent as a received signal to next amplifier 7 and is adjusted so that a maximum voltage value of the received signal falls within a predetermined voltage range in amplifier 7. Moreover, an adjustment method of an amplification rate in amplifier 7 is the same as that of the related art and the description thereof will be omitted.

Reference comparator 8 compares the received signal amplified by amplifier 7 with a reference voltage which is set by reference voltage setting unit 9, and outputs a signal.

Reference voltage setting unit 9 appropriately sets the reference voltage such that a wave of a detection object of the received signal can be detected and in the embodiment, waves of the detection object are four waves, and similar to the related art, the reference voltage is set to an intermediate voltage between a peak of a third wave and a peak of a fourth wave of the received signal after amplification.

Next, an arrival time of the ultrasonic wave from the output of reference comparator 8 and the received signal amplified by amplifier 7 is determined by determination unit 10, and a propagation time of transmission and reception of the ultrasonic wave from the arrival time of the ultrasonic wave determined by determination unit 10 is measured by time measuring unit 11.

Flow rate calculation unit 12 calculates a flow speed and an instantaneous flow rate of the fluid, or an average flow rate for each predetermined period, or the like according to the propagation time measured by time measuring unit 11.

Moreover, each configuration element surrounded by a broken line of FIG. 1 is controlled by a microcomputer or the like as controller 13.

An operation and a process of flow rate measurement device 14 having the above-described configuration will be described below.

First, when flow rate measurement is started, controller 13 sets first ultrasonic wave oscillator 2 as the transmission side and second ultrasonic wave oscillator 3 as the reception side in switching unit 4, and then operates transmitting unit 5 to transmit the ultrasonic wave signal from first ultrasonic wave oscillator 2. From this time, time measuring unit 11 starts measurement.

Next, the ultrasonic wave signal follows arrow Y from arrow X which are the propagation path described above and the ultrasonic wave signal received by second ultrasonic wave oscillator 3 which is set as the reception side is amplified by amplifier 7 as the received signal and is output to reference comparator 8 and determination unit 10.

Reference comparator 8 compares the received signal after amplification by amplifier 7 with reference voltage Vr (intermediate point between the peak of the third wave and the peak of the fourth wave of received signal A indicated by a solid line in FIG. 2), and outputs a signal to determination unit 10.

Determination unit 10 becomes effective from a time point (timing c in FIG. 2) when the signal of reference comparator 8 is output. Time measuring unit 11 performs measurement up to an output timing of output signal D for detecting a first negative zero-cross point (zero-cross point a in FIG. 2) at which a sign of the output of amplifier 7 changes from positive to negative after determination unit 10 becomes effective.

After the zero-cross point (zero-cross point a in FIG. 2) is detected by determination unit 10, the transmission and reception of first ultrasonic wave oscillator 2 and second ultrasonic wave oscillator 3 are switched by switching unit 4, and similarly, the measurement of the propagation time when the ultrasonic wave is transmitted from second ultrasonic wave oscillator 3 and is received by first ultrasonic wave oscillator 2 is performed by time measuring unit 11.

A series of operations is repeated a preset number of times and the flow rate of the fluid to be measured is calculated by flow rate calculation unit 12 based on the obtained propagation time.

The above is a case where water droplets do not adhere to the reflection surface of inner wall 1a of flow path 1 of the ultrasonic wave. Next, an operation of a case where the water droplets adhere to the reflection surface will be described.

When the water droplets adhere to the reflection surface, attenuation of the ultrasonic wave signal arriving at second ultrasonic wave oscillator 3 on the reception side increases due to an influence that a reflection angle of the ultrasonic wave signal is not in one direction or the like compared to the case where there is no water droplet on the reflection surface of the ultrasonic wave, and at the same time, the waveform itself changes.

For example, in a case where attenuation of the fourth wave to a sixth wave having amplitudes larger than those of a first wave to the third wave of the ultrasonic wave signal increases, amplifier 7 amplifies a maximum amplitude of the sixth wave having a large attenuation to be a predetermined amplitude. That is, the amplification rate becomes larger as compared to the case where there is no water droplet. Therefore, the amplitude after amplification of the first wave to the third wave in which the attenuation is small relatively increases compared to the case where there is no water droplet, and a waveform such as received signal B indicated by a broken line of FIG. 2 is obtained.

Therefore, in the case illustrated in FIG. 2, in a case where reference voltage Vr remains unchanged, the third wave is detected, the output of reference comparator 8 becomes timing c0 (output signal C0) and a signal is output at zero-cross point a0 from determination unit 10 (output signal D0).

That is, since originally the fourth wave should be detected but the third wave is detected, the propagation time which is measured by time measuring unit 11 is a time shorter by one wavelength of the ultrasonic wave signal and the flow rate calculated by flow rate calculation unit 12 is obtained as a smaller amount by that much.

Therefore, in the embodiment, in a case where a predetermined condition is satisfied, controller 13 determines that the water droplets adhere to the reflection surface and the reference voltage set by reference voltage setting unit 9 is adjusted, so that the fourth wave can be correctly detected. Hereinafter, description will be given with reference to a flowchart illustrated in FIG. 3.

First, controller 13 adjusts the amplification rate periodically (for example, every minute) in amplifier 7 and amplifies the maximum amplitude of the received signal to a predetermined amplitude (step S101). Next, a difference (difference in the amplification rate) between a previous amplification rate and a current amplification rate is obtained, and if the difference in the amplification rate is a predetermined determination value or more (Yes in step S102), and at that time, instantaneous flow rate Qi calculated by flow rate calculation unit 12 is a predetermined flow rate or less (stable flow rate determination value or less) (Yes in step S103), the adjustment of the reference voltage is performed (step S104).

Here, the adjustment method of the reference voltage which is set by reference voltage setting unit 9 is similar to that of the case without water droplet adhesion, and reference voltage Vr0 is set to an intermediate voltage between a peak voltage of the third wave and a peak voltage of the fourth wave of received signal B indicated by the broken line of FIG. 2. Reference voltage Vr0 obtained by the adjustment is set as a provisional reference voltage and is set as the reference voltage in the next flow rate measurement.

Next, a determination method of whether or not to adopt the provisional reference voltage formally after setting the provisional reference voltage will be described with reference to a flowchart illustrated in FIG. 4.

First, it is determined whether or not the reference voltage which is currently set is the provisional reference voltage (step S201), and if it is the provisional reference voltage, instantaneous flow rate Qi is obtained and it is determined whether or not instantaneous flow rate Qi is a predetermined flow rate or less (stable flow rate determination value or less) (step S202), and if instantaneous flow rate Qi is the predetermined flow rate or less, the current provisional reference voltage is adopted as the formal reference voltage (step S203).

If instantaneous flow rate Qi exceeds the predetermined flow rate, the current provisional reference voltage is discarded and the reference voltage before the adjustment is maintained as the formal reference voltage (step S204).

Here, the predetermined flow rate is a flow rate for determining a state where the flow rate cannot be normally measured due to occurrence of abnormality in a measurement system and is set to a value exceeding a normal measurement range.

As described above, according to the embodiment, even if adhesion of the water droplets on the reflection surface of the ultrasonic wave occurs, it is possible to realize the flow rate measurement device capable of stably measuring the zero-cross point of the fourth wave (wave of the detection object) without causing reduction of measurement accuracy by performing the adjustment of the reference voltage.

As described above, the invention includes the pair of ultrasonic wave oscillators which is provided in the flow path through which the fluid to be measured flows, and is disposed so as to transmit and receive the ultrasonic wave signal by being reflected on the inner wall of the flow path at least once; the transmitting unit that drives the ultrasonic wave oscillators; and the switching unit that switches the transmission and reception of the ultrasonic wave oscillators. In addition, the flow rate measurement device includes the amplifier that amplifies the received signals of the ultrasonic wave oscillators to an amplitude; the reference comparator that compares the output of the amplifier with the reference voltage; the reference voltage setting unit that adjusts and sets the reference voltage; and the determination unit that determines the arrival time of the ultrasonic wave signal from the outputs of the reference comparator and the amplifier. In addition, the flow rate measurement device includes the time measuring unit that measures the propagation time of the transmission and reception of the ultrasonic wave signal from the arrival time of the ultrasonic wave signal determined by the determination unit; and the flow rate calculation unit that calculates the instantaneous flow rate of the fluid to be measured based on the propagation time measured by the time measuring unit. Furthermore, the adjustment of the amplification rate is periodically performed by the amplifier and in a case where the previous and current amplification rates change by a predetermined value or more, and the instantaneous flow rate calculated by the flow rate calculation unit is a predetermined flow rate or less, the reference voltage is adjusted by the reference voltage setting unit.

Therefore, the zero-cross point of the fourth wave can be stably measured by performing adjustment of the reference voltage in a case where a phenomenon capable of estimating adhesion of the water droplets occurs, so that the propagation time can be stably measured and degradation of measurement accuracy can be prevented.

Furthermore, in the invention, after the adjustment of the reference voltage by the reference voltage setting unit, in a case where the instantaneous flow rate calculated by the flow rate calculation unit exceeds a predetermined flow rate, the reference voltage may be reset to the reference voltage before the adjustment.

INDUSTRIAL APPLICABILITY

As described above, the flow rate measurement device according to the invention can measure a correct flow rate even in a case where the water droplets adhere to the reflection surface in a case where the flow rate is calculated by measuring the propagation time by reflecting the ultrasonic wave on the inner wall of the flow path which is referred to as a so-called V path or W path, and can be applied to a wide range of applications such as various gas measuring instruments and large gas meters ranging from home use to business use.

REFERENCE MARKS IN THE DRAWINGS 1, 121 FLOW PATH
2, 122 FIRST ULTRASONIC WAVE OSCILLATOR (ULTRASONIC WAVE OSCILLATOR)
3, 123 SECOND ULTRASONIC WAVE OSCILLATOR (ULTRASONIC WAVE OSCILLATOR)
4, 124 SWITCHING UNIT
5, 125 TRANSMITTING UNIT
6 RECEIVING UNIT
7, 126 AMPLIFIER
8, 127 REFERENCE COMPARATOR
9 REFERENCE VOLTAGE SETTING UNIT
10, 128 DETERMINATION UNIT
11, 129 TIME MEASURING UNIT
12 FLOW RATE CALCULATION UNIT
13, 130 CONTROLLER
14 FLOW RATE MEASUREMENT DEVICE

The invention claimed is:
1. A flow rate measurement device comprising:
a pair of ultrasonic wave oscillators which is provided in a flow path through which a fluid to be measured flows, and is disposed so as to transmit and receive an ultrasonic wave signal by causing the ultrasonic wave signal to be reflected on an inner wall of the flow path at least once;
a transmitting unit that drives the ultrasonic wave oscillators;
a switching unit that switches transmission and reception of the ultrasonic wave oscillators;
an amplifier that amplifies the ultrasonic wave signal received by each of the ultrasonic wave oscillators to a predetermined amplitude;
a reference comparator that compares an output of the amplifier with a reference voltage;
a reference voltage setting unit that adjusts and sets the reference voltage;
a determination unit that determines an arrival time of the ultrasonic wave signal from outputs of the reference comparator and the amplifier;
a time measuring unit that measures a propagation time of transmission and reception of the ultrasonic wave signal from the arrival time of the ultrasonic wave signal determined by the determination unit; and
a flow rate calculation unit that calculates an instantaneous flow rate of the fluid to be measured based on the propagation time measured by the time measuring unit,
wherein adjustment of an amplification rate is periodically performed by the amplifier and where a difference between a previous amplification rate and a current amplification rate is a predetermined value or more, and the instantaneous flow rate calculated by the flow rate calculation unit is a predetermined flow rate or less, the reference voltage is adjusted by the reference voltage setting unit, and
when the reference voltage is adjusted by the reference voltage setting unit, and then the instantaneous flow rate calculated by the flow rate calculation unit exceeds the predetermined flow rate, the reference voltage is reset to a reference voltage before the adjustment.

* * * * *